(12) United States Patent
Choi

(10) Patent No.: US 8,587,046 B2
(45) Date of Patent: Nov. 19, 2013

(54) SYSTEM WITH LOGIC AND EMBEDDED MIM CAPACITOR

(75) Inventor: Jeong Y Choi, Palo Alto, CA (US)

(73) Assignee: MoSys, Inc., Santa Clara, CA (US)

( * ) Notice: Subject to any disclaimer, the term of this patent is extended or adjusted under 35 U.S.C. 154(b) by 0 days.

(21) Appl. No.: 13/191,423

(22) Filed: Jul. 26, 2011

(65) Prior Publication Data

US 2012/0025285 A1    Feb. 2, 2012

(51) Int. Cl.
*H01L 27/108*   (2006.01)
*H01L 21/8242*  (2006.01)
*G11C 11/24*    (2006.01)

(52) U.S. Cl.
USPC ............ 257/296; 257/E27.084; 257/E21.647; 438/239; 365/149

(58) Field of Classification Search
CPC .......... H01L 27/10851; H01L 27/10894; H01L 27/105; H01L 27/108; H01L 28/40; H01L 28/55; G11C 11/404; G11C 11/405

USPC .......... 257/296, E27.084, E21.647; 438/239, 438/241, 253; 365/149, 207, 226
See application file for complete search history.

(56) References Cited

U.S. PATENT DOCUMENTS

| 6,528,366 B1 * | 3/2003 | Tu et al. .......... 438/253 |
| 6,720,232 B1 * | 4/2004 | Tu et al. .......... 438/396 |
| 2004/0232462 A1 * | 11/2004 | Takeuchi .......... 257/296 |

* cited by examiner

*Primary Examiner* — Nikolay Yushin
(74) *Attorney, Agent, or Firm* — MoSys, Inc.

(57) ABSTRACT

An embedded memory system includes an array of random access memory (RAM) cells, on the same substrate as an array of logic transistors. Each RAM cell includes an access transistor and a capacitor structure. The capacitor structure is fabricated by forming a metal-insulator-metal capacitor in a dielectric layer. The embedded RAM system includes fewer metal layers in the memory region than in the logic region.

29 Claims, 8 Drawing Sheets

SYSTEM WITH LOGIC AND EMBEDDED MIM CAPACITOR

CROSS-REFERENCE TO RELATED APPLICATIONS

This application claims priority to U.S. utility application, Ser. No. 12/804,855, filed Jul. 30, 2010, now U.S. Pat. No. 8,460,995, issued Jun. 11, 2013, entitled: "Method of Forming a MIM Capacitor," which application is also incorporated by reference in its entirely herein.

FIELD OF THE INVENTION

The present disclosure relates to a semiconductor structure that contains embedded memory in a logic device, and the method for forming such a structure. More specifically, the present disclosure further relates to a RAM system that is fabricated using a modified conventional logic process.

BACKGROUND OF THE INVENTION

Different functional blocks, such as logic and memory, can be combined on a single IC chip. Memory and logic components are generally formed using different process technologies to enhance the performance of each individual component. To effectively integrate distinct functional blocks, the overall manufacturing process tries to avoid modifications having significant complexity.

One type of embedded memory is embedded dynamic random access memory (eDRAM), a capacitor-based dynamic random access memory that is integrated on the same die as logic circuits. While a cost-per-bit for eDRAM might be higher than for stand-alone DRAM, the eDRAM provides improved performance in many applications over external memory. Use of embedded memory on a die with logic or more particularly a processor, allows for wider busses and higher operation speeds. Furthermore, embedded memory can have higher density in comparison to conventional SRAM. Potentially higher cost of eDRAM, due to extra fab process steps as compared with embedded SRAM, are offset by substantial area savings. If the memory refresh controller, required for volatile DRAM, is embedded along with the eDRAM memory, the memory system appears as a simple SRAM type of memory to the balance of the logic, and is sometimes referred to as 1T-SRAM.

The name 1T-SRAM arises from the use of a single-transistor storage cell (bit cell), similar to dynamic random access memory (DRAM), but with control circuitry around the bit cell that makes the memory functionally equivalent to conventional SRAM. That is, the controller hides all DRAM-specific operations such as precharging and refresh.

A capacitor is a device comprised of two conductors separated by a non-conductor, or dielectric, that stores an electric charge. Discrete capacitor devices are frequently constructed of metal foil sheets separated by a layer of insulating film. When a potential difference (voltage) exists across the conductors, a static electric field develops across the dielectric, causing positive charge to collect on one plate and negative charge on the other plate. Energy is stored in the electrostatic field. The capacitance is greatest when there is a narrow separation between large areas of conductor. Typically, a discrete device is constructed to have optimal capacitive properties. However, in other situations, normal circuitry with conductive metals separated by an insulating dielectric material, can behave as a capacitor if their geometries and arrangements approach those of the capacitor defined above, e.g., narrow separation between large areas of conductor separated by an insulator. These unintended capacitive properties can be referred to as parasitic capacitance, which undesirably affects signal levels, signal speed, and signal integrity.

While an eDRAM system utilizes a specific capacitor device, such as a trench capacitor, or a metal-insulator-metal (MIM) capacitor, built into the semiconductor structure to store a desired charge for a logic level, the logic circuit controlling the eDRAM can unintentionally have parasitic capacitance behavior. Logic circuits are much more sensitive to speed and signal integrity for critical timing paths and reliable switching.

SUMMARY OF INVENTION

An improved method and apparatus for an embedded random access memory (RAM) system with a metal-insulator-metal (MIM) capacitor is achieved. The RAM system of the present disclosure has an embedded memory and a logic circuit on the same substrate. The RAM can be either dynamic RAM (DRAM) or static RAM (SRAM), e.g., 6-transistor (6-T) cell. In particular, a MIM capacitor can be used in a DRAM cell as a storage capacitor and in a SRAM cell to improve the soft error rate (SER).

In a particular embodiment, the disclosure concerns a semiconductor structure having reduced parasitic resistance and/or capacitance. The structure includes a semiconductor substrate that is divided into a memory region, with a MIM capacitor, and a logic region, wherein one or more metal layers, e.g., a first metal layer is disposed in either the memory region and/or the logic region and is located at a level in the semiconductor structure that corresponds to a location between a top surface and a bottom surface of the MIM capacitor. Thus, the MIM capacitor and the one or more metal layers coexist at a same range of levels, or layers, from the semiconductor substrate. In another embodiment, the given metal layer exists only in the logic region.

A dielectric layer, containing a MIM capacitor, is disposed over the memory, or DRAM, region. The dielectric layer, also present in the logic region, functions as an interlevel dielectric layer through which two metal layers electrically connect using a via filled with a conductive material. The same metal layer present in both the DRAM region (as a first metal layer), and the logic region (as a second metal layer) is coupled to the underlying substrate. A coupling via present in only the memory region electrically couples the MIM capacitor to the metal layer immediately adjacent to the coupling via.

Thus, the present disclosure reduces parasitic capacitance between the source contacts and the drain contacts of the logic transistors, which are more sensitive to switching speeds than memory transistors, by having one or more metal layers located as close to the source/drain contacts as possible, e.g., below the top surface of the MIM capacitor. The more source and drain contacts per transistor, e.g., three contacts for each source and three contacts for each drain for a given transistor, and the closer the source is to the drain, e.g., for smaller size and to minimize the effect of source (S) and drain (D) resistance, then the more they act as a plate capacitor. By keeping the contacts short, e.g., by using the metal layer as low in the layer structure as possible, the less the parasitic capacitance created between the source and the drain contacts. By communicating signals to upper metal layers using via plugs, coupled to the metal layer, that are fewer in number and that are spaced farther apart from each other than the source and drain contacts, the less the parasitic capacitance in the system compared to using the contacts to reach an upper metal layer. By reducing the parasitic capacitance of the system, the RC time constant is correspondingly reduced, which then increases the switching speed of the logic transistor.

Furthermore, by co-locating the one or more metal layers with the MIM capacitor, e.g., above the bottom surface of the MIM capacitor, or at the same layer heights as the MIM capacitor, the overall structure of MIM capacitor and metal layers is shorter, compared to an alternative embodiment of locating the MIM cell above a first metal layer. The result is a shorter contact/via plug height, which reduces the resistance of the circuit, correspondingly reduces the RC time constant, and thereby increases the switching speed of the transistor. While a metal layer can be utilized for a transistor in the memory region adjacent to the MIM capacitor, e.g., below the top surface of the MIM capacitor and above the bottom surface of the MIM capacitor, the memory cell may require wider spacing in order to provide sufficient insulating distance between the metal line and the MIM capacitor. However, by having a metal layer only in the logic region, located at a level below the top surface of the MIM capacitor and above the bottom surface of the MIM capacitor, all the benefits of reduced parasitic capacitance and resistance mentioned herein is achieved, from shorter contacts and fewer via plugs that are spaced further apart than the contacts are achieved, without having a wider memory cell.

The present disclosure is also directed to a method for forming an embedded DRAM system that includes DRAM cells and logic transistors on a single substrate, where the contacts are formed from different conductive material. The use of two different types of plugs reduces the overall interconnect resistance, because at least one of the plugs is a lower resistance material, which thereby improves system level performance by enhancing the speed and power features of the present disclosure.

BRIEF DESCRIPTION OF THE DRAWINGS

Example embodiments are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

The present disclosure provides several methods for fabricating an embedded DRAM system having an improved interconnect resistance and reduced parasitic capacitance, both of which result in a lower RC time constant and improved transistor switching speeds. As devices scale downward in geometry, the interconnect resistance and parasitic capacitance can affect performance. The present disclosure reduces the interconnect resistance through the processes and resulting structures described herein, e.g., by either reducing via height or by using low resistance materials, like copper-based metals, for some or all vias and/or metallization layers in a given region. The present disclosure also reduces the parasitic capacitance by reducing the effective surface area of the two sets of transistor contacts, e.g., the source and drain, facing each other by maintaining their height as low as possible, and by coupling the contacts to metallization layers and vias that are: located at a lower layer in the semiconductor structure; spaced further apart from each other than the set of contacts; and/or have less surface area facing each other.

Figure 1A:
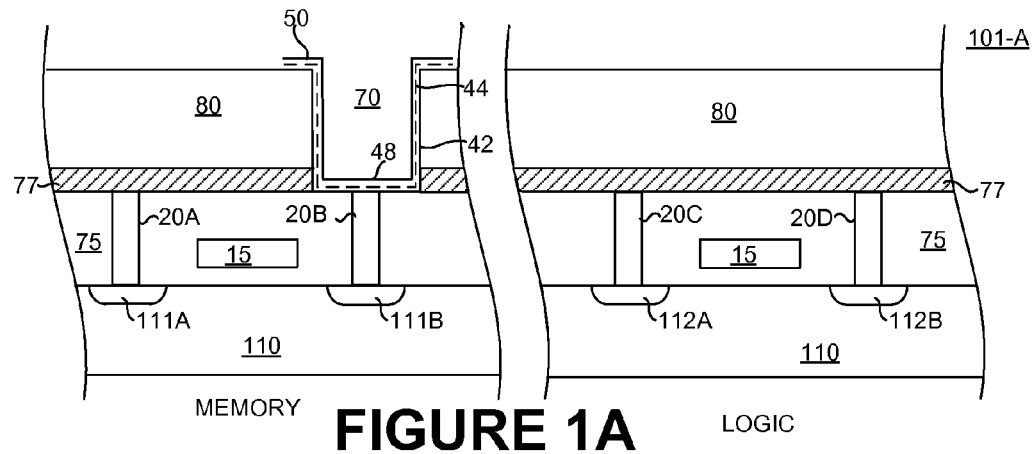
FIGS. 1A-1C illustrate cross-sectional views of a process flow for forming an embedded DRAM system having a MIM capacitor in accordance with a first embodiment of the present disclosure.
Figure 1B:
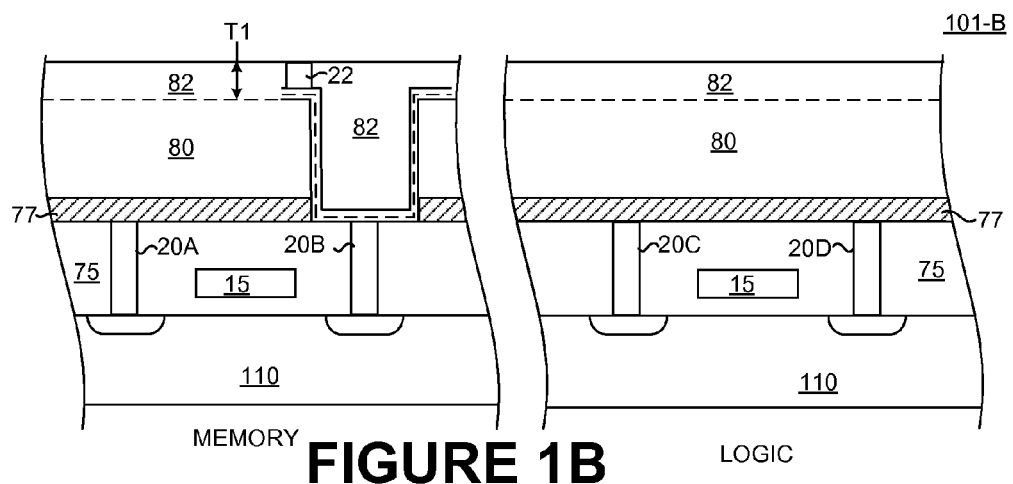
Figure 1C:
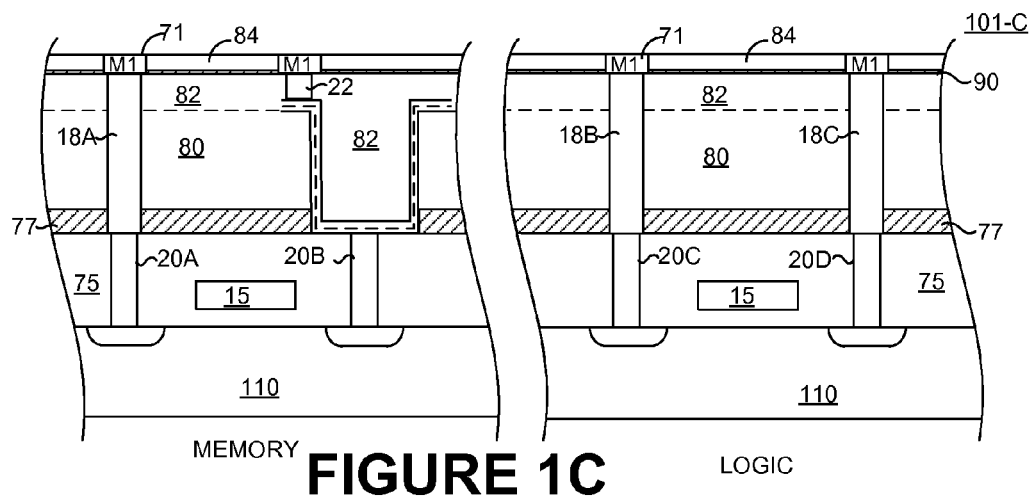

The present disclosure will be more readily understood in reference to FIGS. 1A-1C. A portion of a semiconductor structure 101-A is shown in FIG. 1A. Specifically, FIG. 1A illustrates a doped substrate 110 upon which an insulating layer 75 is formed. Gates 15 are formed on the substrate, in both the logic and the memory region, in accordance with known techniques. Substrate 110 is provided with drain region, or bit line, 111A and with source 111B in the memory region. Substrate 110 is also provided with source/drain regions 112A and 112B in the logic region. Semiconductor structure 101-A also includes a set of contacts 20A/20B in the memory region coupled to the drain 111A and the source 111B, respectively, and a set of contacts 20C/20D in the logic region coupled to the source 112A and the drain 112B, respectively. A first dielectric layer 80, spanning both regions, with a thickness of between about 5000 and 100,000 angstroms. Portions of dielectric layers 80 and 77 are etched to form an opening having a lower surface contiguous with dielectric layer 75 and contact 20B. Within the opening, a lower capacitor plate 42 is deposited that is contiguous with contact 20B. Lower capacitor plate 42 is etched to desired size. Upon lower capacitor plate 42 is provided an insulating layer 44 first and then an upper capacitor plate 48. Upper capacitor plate 42 is then etched to a desired size. In other embodiments, the 3-layer stack consisting of the upper capacitor plate 48, the insulating layer 55, and the lower capacitor plate 42 may be simultaneously etched with one masking step. Suitable materials for the capacitor plates include, but are not limited to, TiN, Ta, or TaN. The resulting stack is then masked and etched in a conventional manner to form MIM capacitor 50. The interior of capacitor 50 is shown as cavity 70.

A dielectric layer 82 is disposed to fill cavity 70 of capacitor 50, thereby increasing the thickness of layer 80 by an amount T1. The thicker dielectric layer is shown as layer 82 in FIG. 1B. Distance T1 may have a thickness ranging from 2000-7000 angstroms. In other embodiments, T1 may be formed by disposing a much thicker layer, thicker than layer 80, and then polishing the structure to the desired thickness level. After dielectric layer 82 is formed, a mask (not shown) is disposed over the partially completed semiconductor structure 101-B and dielectric layer 82 is selectively etched to form via 22. Via 22 is filled with a conductive material, such as tungsten, to form the structure of FIG. 1B. By separately forming conductive plug 22, the present disclosure reduces the interconnect resistance of the eDRAM memory systems because it allows at least one other plug to be made of a lower resistivity metal, such as a copper metal or copper-based alloy.

A dual damascene process may be used to form vias 18A, 18B and 18C, and metallization region M1 71 after plug 22 is formed. This is achieved by providing etch-stop layer 90 and dielectric layer 84 over the entire semiconductor structure 101-C as shown in FIG. 1C. Then, grooves for M1 are formed in layer 84 down through the depth of layer 90. In addition, via holes 18A, 18B and 18C are formed in layer 82 down through the depth of layer 77.

Figure 2A:
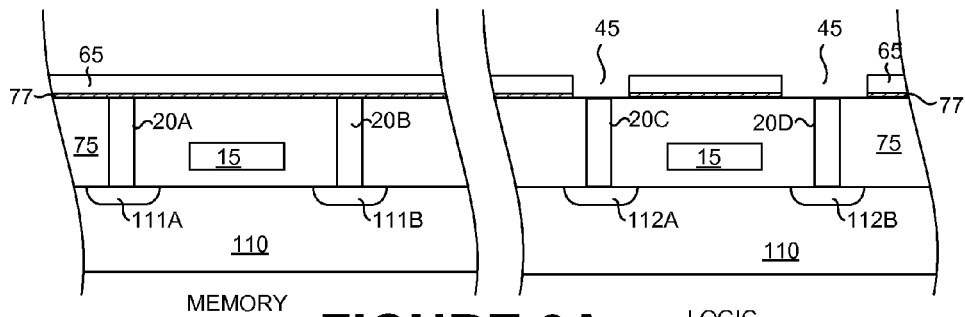
FIGS. 2A-2D illustrate cross-sectional views of a process flow for forming an embedded DRAM system having a MIM capacitor in accordance with a second embodiment of the present disclosure.

An alternative embodiment of the present disclosure is shown in FIGS. 2A-2D, in which a semiconductor structure 102-A to 102-D having an eDRAM system with copper-filled vias is formed. A partially completed semiconductor structure is shown in FIG. 2A, where a set of contacts 20A, 20B and 20C, 20D are provided in insulating layer 75 of the memory region, and the logic region, respectively, to couple with source/drain regions 111A, 111B, and 112A, 112B, respectively, disposed in substrate 110 to create a memory region transistor and a logic region transistor, respectively. Grooves 45 for M1 regions are shown in only the logic region of the structure, because M1 is not utilized in the memory region. The M1 regions are usually fabricated to have a thickness of between 2000 to 7000 angstroms, but can have a wide range of thicknesses depending upon the desired process and design rules. Etch-stop layer 77 is also shown in FIG. 2A covering insulating layer 75 and contacts 20A/20B.

Figure 2B:
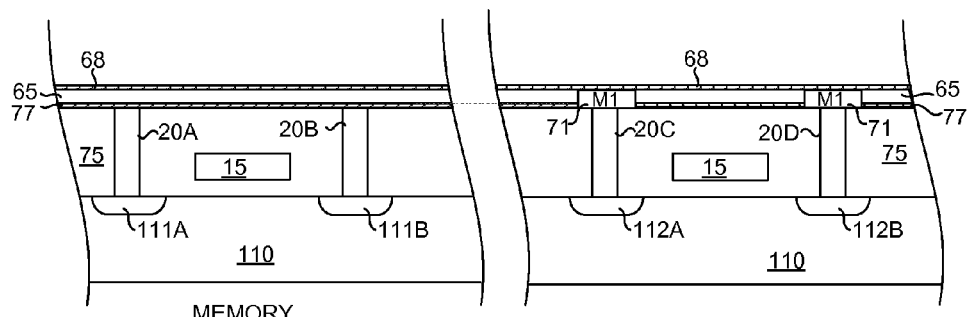

Turning to FIG. 2B, metal layer M1 71 is formed in the grooves 45 to complete metal lines in the logic region. Then, a second etch-stop layer 68 is provided above dielectric layer 65 in both memory and logic regions and above metal lines 71 in logic region.

Figure 2C:
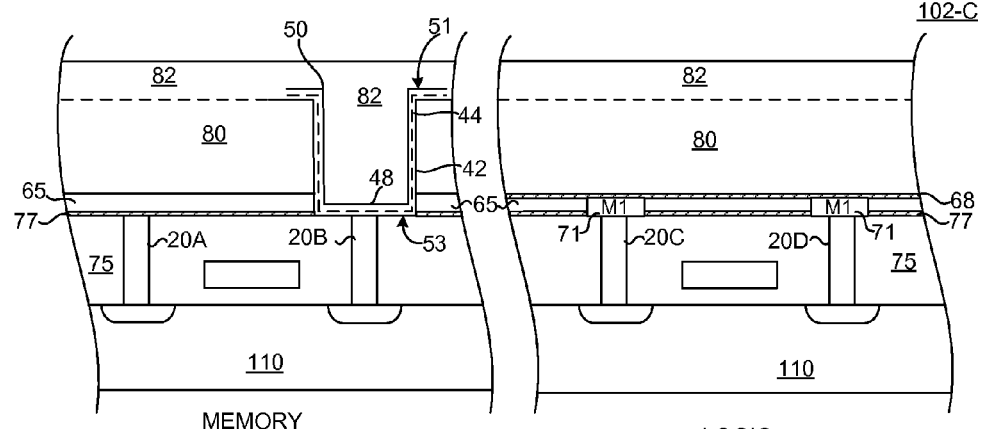

The process continues in FIG. 2C, where a mask (not shown) is provided over the logic region but not the memory region, in order to enable the removal of both etch-stop layer 68 (and optionally dielectric layer 65) from the memory region. Removal of layer 68 from only the DRAM area allows direct connection between contact 20A and the later formed via 18A (shown in FIG. 2D). Subsequently, a first dielectric layer 80 is disposed on layer 65 (or 77) in the memory region and on layer 68 in the logic region. A portion of layers 80, 65 (if layer 65 not removed in the prior etch operation), and 77 are then removed in order to form MIM capacitor 50, whose formation operations are described in FIG. 1A, regarding lower capacitor plate 42, insulating layer 44, and upper capacitor plate 48. Next, a second dielectric layer 82 is provided above dielectric layer 80 to fill the cavity 70 of capacitor 50, and to increase the thickness of dielectric layer 80.

Figure 2D:
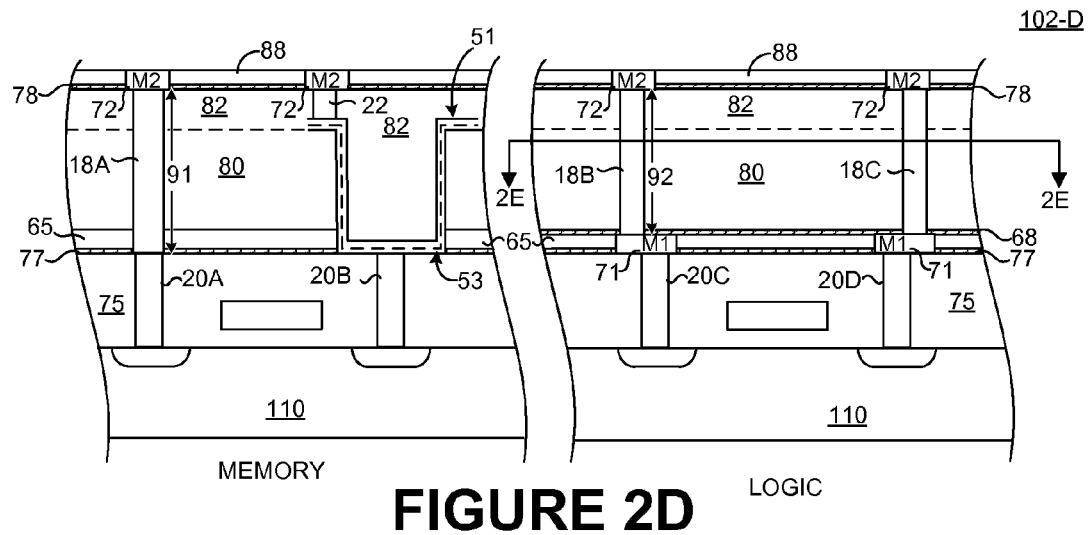

In FIG. 2D an etch-stop layer 78 is provided over dielectric layer 82, which in turn is covered by a third dielectric layer 88. Then, layer 88 is patterned to create grooves (not shown) for metallization region M2 interconnects 72. A mask (not shown) is placed on dielectric layer 88 and patterned to simultaneously form vias 18A, 18B, 18C and 22. FIG. 2D illustrates the result of performing a conventional dual damascene process to fill grooves 45 (shown in FIG. 2A) and vias 18A, 18B and 18C with copper. Via 22 can be filled with tungsten beforehand, or filled with copper simultaneous with the other vias. In one embodiment, the M2 region is formed to have an equivalent thickness as the M1 region in order to maintain the small size of the conventional MIM cell. However, due to the absence of the metal 1 layer (M1) in the memory region, via 18A in the memory region must be etched to a depth of 2000-7000 angstroms greater than the depth of vias 18B and 18C in the logic region, e.g. to accommodate the thickness of metallization layer M1 71. Layers 77 and 68 serve as etch-stop layers for the via etching operations in the memory and logic regions, respectively.

The present disclosure reduces the contact height in the logic region by using a metal 1 layer in only the logic portion of the system and by using it at a level in the semiconductor structure that corresponds to being at or above the bottom surface 53 or at or below the top surface 51, of MIM capacitor 50. As a result, the RC in the logic region is also reduced. This process leads to the contact resistance and capacitance of the eDRAM system being maintained at the values expected for a pure logic process. In other words, the vertical contact in the logic region does not require a process change in the present disclosure when using a pure logic process without for embedded memory. Moreover, the absence of M1 regions in the memory region produces a smaller cell size and an eDRAM system having an RC in the logic region equivalent to the RC of a logic device without memory. In all embodiments having one or more metal layers, e.g., M1 layer 71, only in the logic region, the resulting via plugs, e.g., in 18B, in the logic region, will have a height 92 that is less than a height of via plug, e.g., in 18A, in the memory region, with a corresponding reduction in parasitic resistance and capacitance.

Figure 2E:
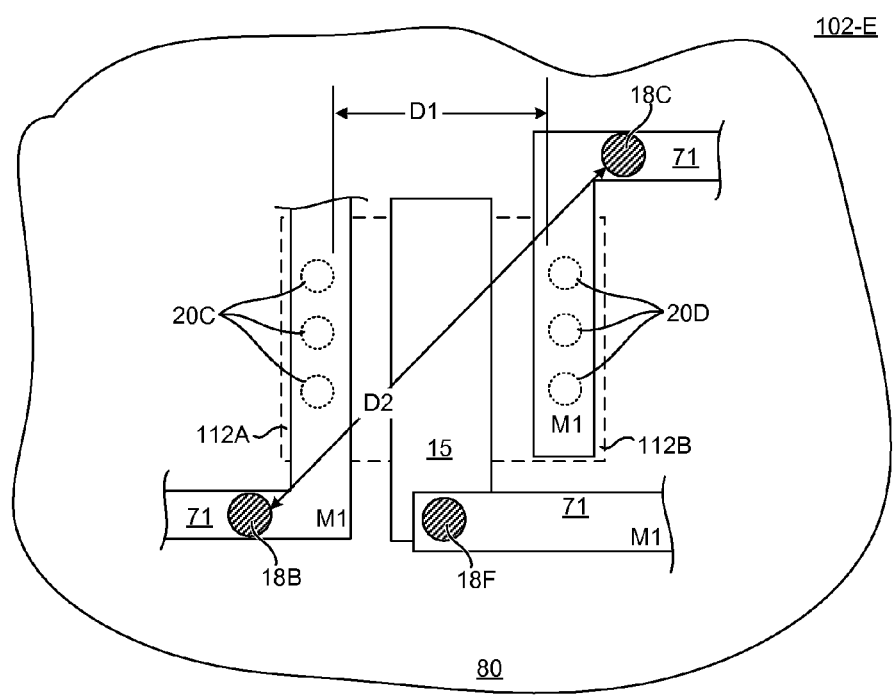
FIG. 2E illustrates a top view of a semiconductor structure with an embedded DRAM system having reduced parasitic capacitance in a logic region, in accordance with one or more embodiments of the present disclosure.

Referring now to FIG. 2E, a top view (section 2E-2E of FIG. 2D) of a semiconductor structure 102-E with an embedded DRAM system having reduced parasitic capacitance in a logic region is shown, in accordance with one or more embodiments of the present disclosure. Bank of three S contacts 20C and bank of three D contacts 20D act to unintentionally form two plates of a de facto parasitic capacitor, separated by insulator 80 at a distance D1. In comparison, by utilizing plug vias 18B and 18C to carry the signals to and from transistor drain 112B and source 112A to upper metal layers, less parasitic capacitive effect exists in the system because via plugs 18B and 18C can be placed further apart, at distance D2 which is substantially greater than D1, and because they have a smaller surface to act as a capacitive plate. Via plug 18F may be used and coupled to metallization layer M1 71 which is coupled to gate 15 by contact (only shown in top view). While only one via plug 18B, 18C is used for each of S 112A and D 112B in FIG. 2E, for a critical application requiring even lower resistivity, multiple via plugs can be used and/or lower resistivity conductive material can be used for the plugs, e.g., copper. These multiple via plugs would still have a lower parasitic capacitive value than extending contacts 20C and 20D higher through dielectric layers because the via plugs are still spaced further apart D2 from each other than the distance between S and D contacts, D1, which would thereby lead to a lower parasitic capacitive effect of the system. Alternatively, if vias 18A-C and 22 are filled with a higher resistance material, such as tungsten, a lower system resistance can be achieved by routing the circuit at the M1 metallization layer. While view 102-E provides a specific layout, the present disclosure is well suited to a wide range of via and M1 positioning that would provide distance D1 greater than S and D distance D1.

An alternative embodiment for reducing the interconnect RC of the present disclosure is shown in FIGS. 3A-3D, in which a semiconductor structure 103-A through 103-D has an eDRAM system with two different types of conductive plugs is shown. This embodiment is directed to an eDRAM system in which the copper via is not allowed to directly touch the MIM electrode.

Figure 3A:
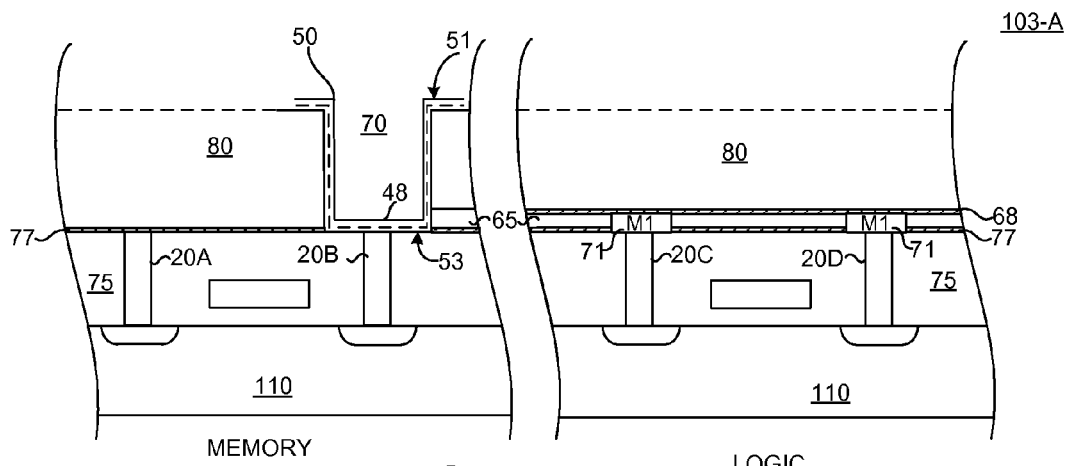
FIGS. 3A-3D illustrate cross-sectional views of a process flow for forming an embedded DRAM system having a MIM capacitor and two different plugs in accordance with a third embodiment of the present disclosure.

Referring to FIG. 3A partially completed semiconductor structure 103-A with metallization layer M1 71 disposed in dielectric layer 65 and electrically coupled to contacts 20C and 20D in the logic region. Dielectric layer 80 is disposed thereon. The MIM capacitor 50 is fabricated according to the process described for FIG. 2C. In the resulting structure, metallization layer M1 71 is effectively located at a level above substrate 110 corresponding to a position between the upper surface 51 and lower surface 53 of MIM capacitor 50.

Figure 3B:
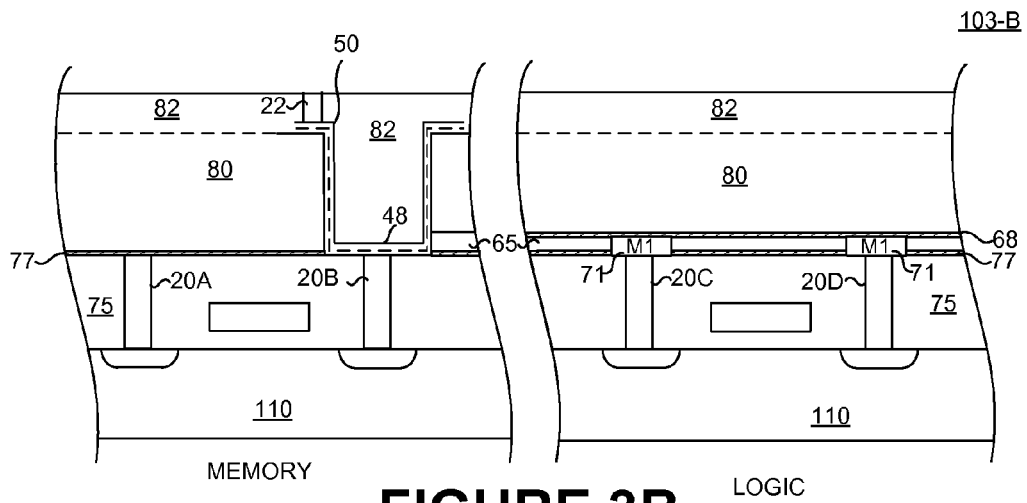

Referring now to FIG. 3B, a dielectric layer 82 is deposited above dielectric layer 80, which also fills cavity of capacitor 50, and increases the thickness of that given dielectric layer. A mask (not shown) is disposed over dielectric layer 82 to selectively etch via 22 down to upper capacitor plate 48 of MIM capacitor 50. Via 22 is then filled with tungsten in the present embodiment.

Figure 3C:
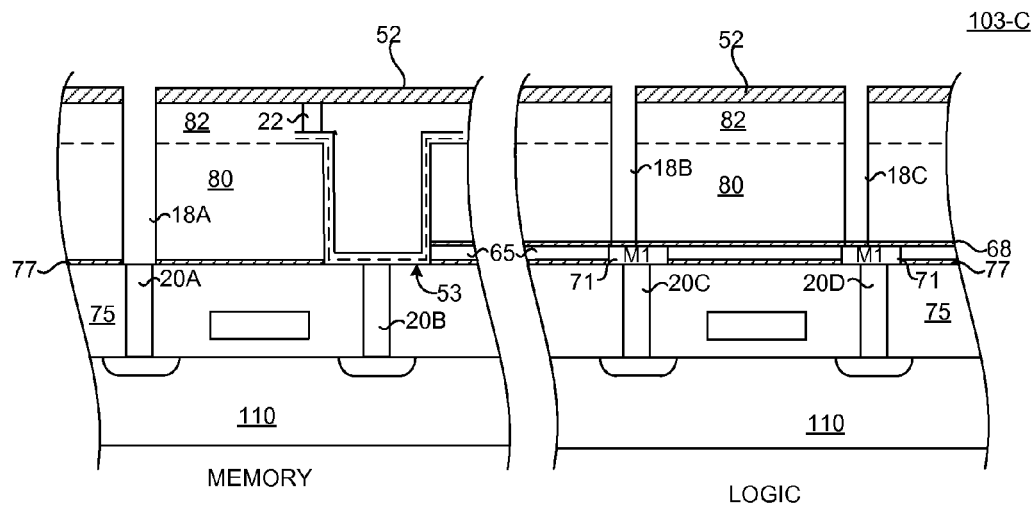

As shown in FIG. 3C, mask 52 is placed over via 22 and dielectric layer 82 to define the areas where vias 18A, 18B and 18C will be created. Vias 18A is etched through dielectric layers 82 and 80 and etch-stop layer 77 to reach contact 20A. Vias 18B and 18C are etched through dielectric layers 82 and 80 and dielectric layer 68 to reach metallization layer M1 71. Mask 52 is removed after vias 18A, 18B and 18C are formed. Then, vias 18A, 18B, and 18C are filled with a conductive material, e.g., tungsten.

Figure 3D:
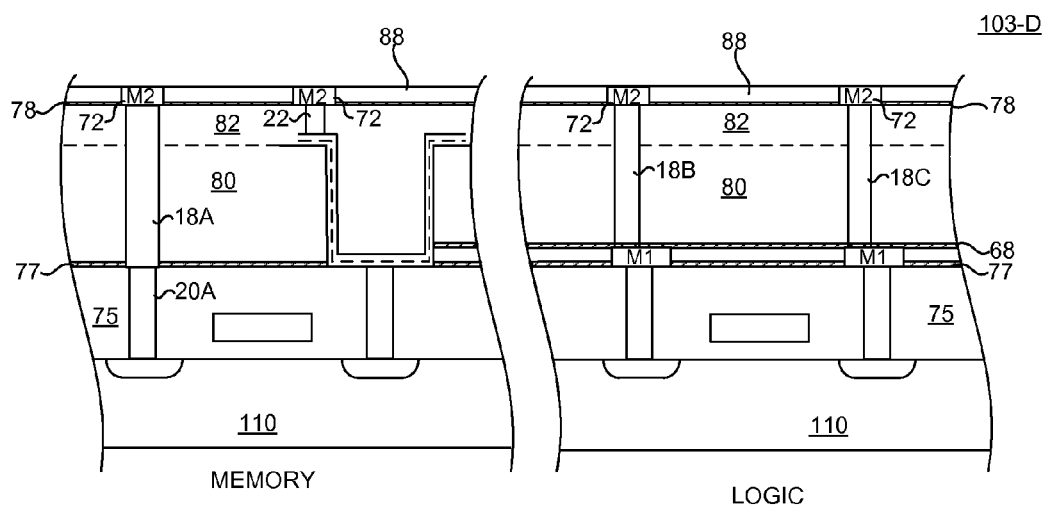

Referring now to FIG. 3D, etch-stop layer 78 is provided over dielectric layer 82 and via plugs 18A, 18B and 18C and 22 to provide for a controlled etch in the future process operations. Dielectric layer 88 is then provided over etch-stop layer 78, and subsequently patterned to form grooves (not shown) for the second metallization regions (M2) 72. Then, grooves (not shown) are filled with a conductive material having a lower resistance value than tungsten, e.g., filled with copper. In an alternative embodiment, vias 18A, 18B, and 18C, and metallization region M2 72 can be etched through dielectric layers and etch-stop layers noted above. Then using a dual damascene process, metallization layer interconnects M2 72 and vias 18A, 18B, and 18C can be filled with copper using a dual damascene process. The resulting structure has both a reduced interconnect resistance and a reduced capacitance compared to other embedded DRAM systems. Additional metal layers may be provided, if desired, above M2 to form a more complex interconnect.

Figure 4:
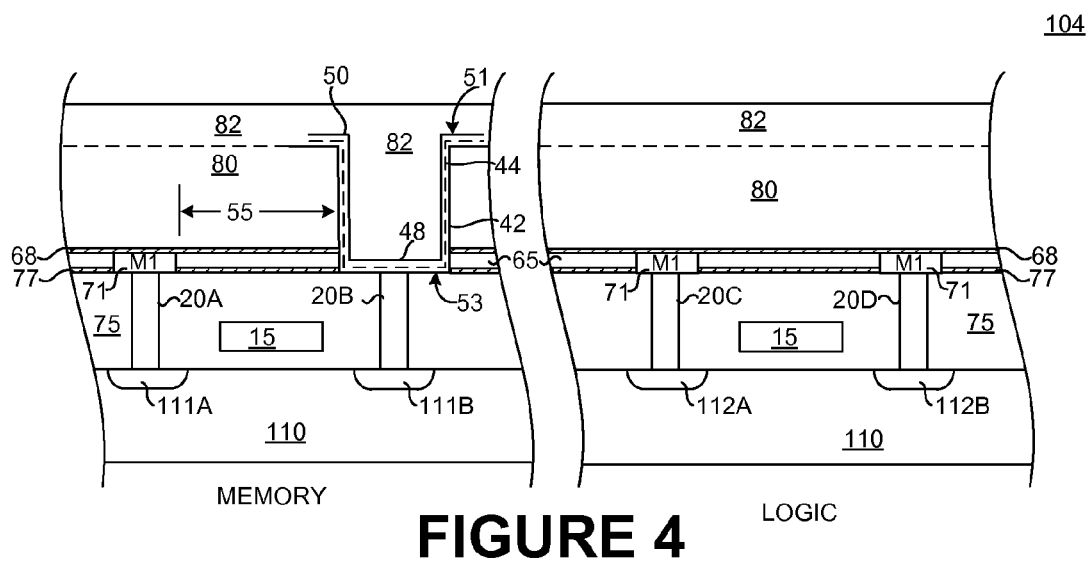
FIG. 4 illustrates a cross-sectional view of one portion of a process flow for forming an embedded DRAM system having a first metal layer in the memory region located between a top and bottom surface of a MIM capacitor in accordance with a fourth embodiment of the present disclosure.

Referring now to FIG. 4, a cross-sectional view of one portion of a process flow for forming a semiconductor structure 104 having an embedded DRAM system with a first metal layer in the memory region located at a layer corresponding to a location between a top and bottom surface of a MIM capacitor is shown, in accordance with a fourth embodiment of the present disclosure. Semiconductor structure 104 corresponds directly to FIG. 2C with the addition of a metal layer, M1 interconnect 71, located in memory region between a top surface 51 and a bottom surface 53 of MIM capacitor 50, and coupled to drain 111A through contact 20A. Note that a via, similar to 18A of FIG. 3D, is not used in memory section of FIG. 4, because M1 71 over contact 20A completes the routing for a bit line. Subsequent processing operations for vias and plugs with corresponding conditions is per FIGS. 2D, 3C and 3D, or 5B-5C.

While using metal layer M1 interconnect 71 in memory region may reduce parasitic capacitance in the memory cell, because less vias are required to reach an upper metal layer from the contacts, and because the vias can be spaced further apart than the source and drain can be spaced from each other, there are other tradeoffs to consider. If the metal layer M1 is located in memory region at a layer location at or above the bottom surface 53 and at or below the top surface 51 of the MIM capacitor 50, then a minimum clearance distance 55 between the metal interconnect 71 and the capacitor 50 is used for signal isolation. This clearance will increase the overall width of the memory cell and possibly create other tradeoffs that make the use of a metal layer in the memory region, at the layer location described, as less desirable. For this reason, alternative embodiments herein avoid a metal layer in the memory region at a layer location between the top surface and the bottom surface of the MIM capacitor 50.

Figure 5A:
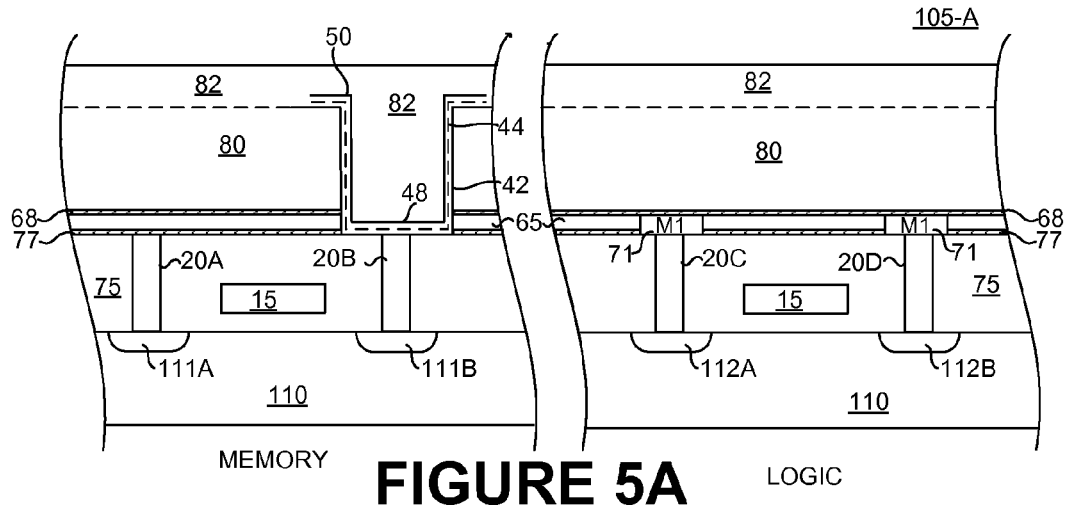
FIGS. 5A-5C illustrate cross-sectional views of a process flow for forming an embedded DRAM system having a MIM capacitor by different sequencing of via formation in accordance with a fifth embodiment of the present disclosure.
Figure 5B:
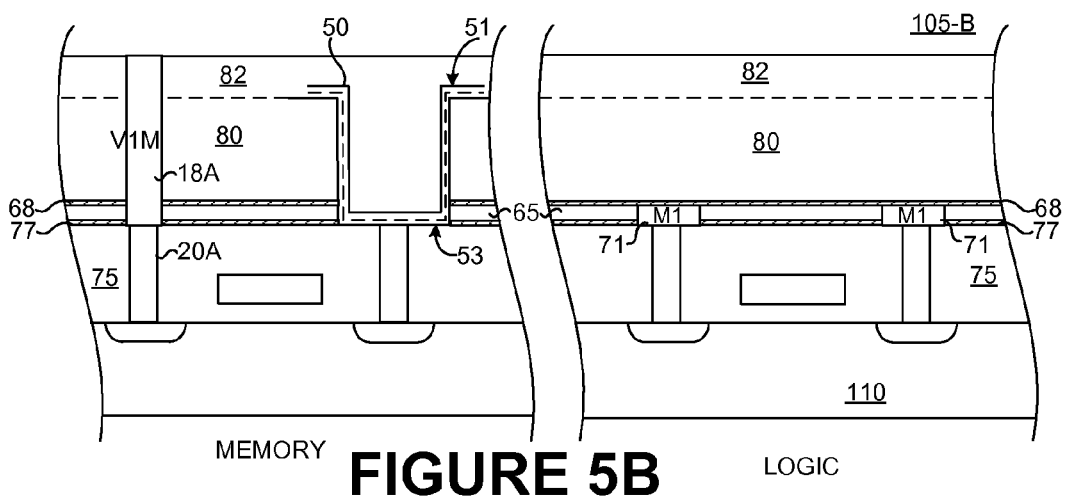
Figure 5C:
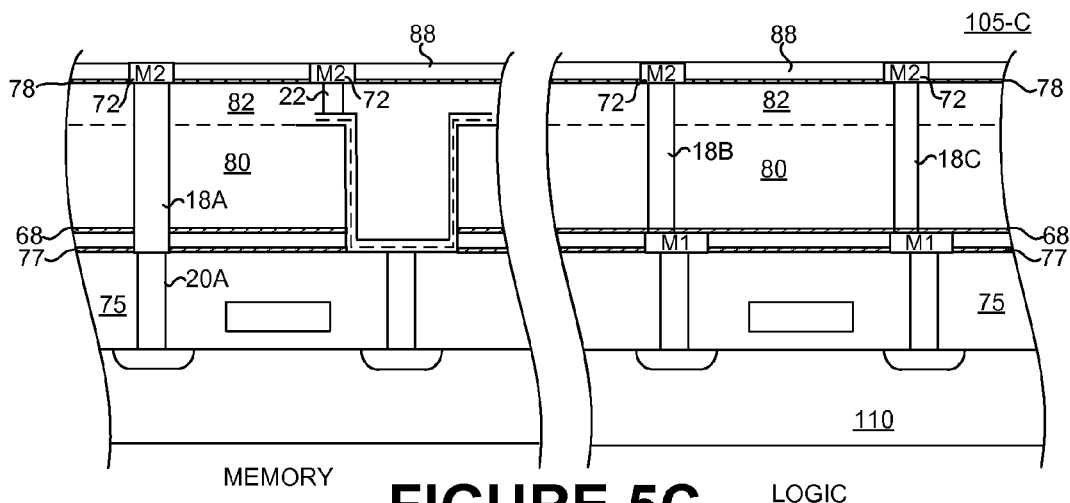

Referring now to FIGS. 5A-5C, cross-sectional views of a process flow for forming an embedded DRAM system having a MIM capacitor by different sequencing of via formation is shown, in accordance with a fifth embodiment of the present disclosure. Partially completed semiconductor structure 105-A of FIG. 5A is fabricated according to the process described for FIGS. 2A-2C, including the conventional process to form M1 first metal layer 71. While etch-stop layer 68 and dielectric layer 65 are capable of being removed prior to forming dielectric layer 80 for a simplified etching of via 18A, the illustration retains etch-stop layer 68 and dielectric layer 65 in the memory region, except as required for the formation of MIM capacitor 50. To form the MIM capacitor 50, dielectric layers 80 and 65 and etch-stop layers 68 and 77 are etched and MIM capacitor is formed therein as described in FIG. 2C. After completion of the MIM capacitor 50, second dielectric layer 82 is then formed as described in FIG. 2C. In FIG. 5B, a mask (not shown) is placed over dielectric layer 82 to form V1M via 18A in memory region, which penetrates etch-stop layers 68 and 77 to reach contact 20A. Via 18A is then filled with a conductive material, such as tungsten, which has beneficial filling properties for deep vias, such as via 18A, as evidenced by via height 91 as compared in FIG. 2D.

In FIG. 5C, etch-stop layer 78 is provided over second dielectric layer 82, which in turn is covered by a third dielectric layer 88. Then, layer 88 is patterned to create grooves (not shown) for metallization region M2 interconnects 72. A mask (not shown) is placed on dielectric layer 88 and patterned to simultaneously form interconnect via 22 to MIM capacitor 50, and to form vias 18B and 18C, as the difference in via depth is not as drastic as it would be with via 18A. Thereafter, grooves for metallization region M2 interconnects 72 and vias 22, 18B and 18C may simultaneously be filled with a conductive material, e.g., copper using a dual damascene process.

Figures 6A, 6B:
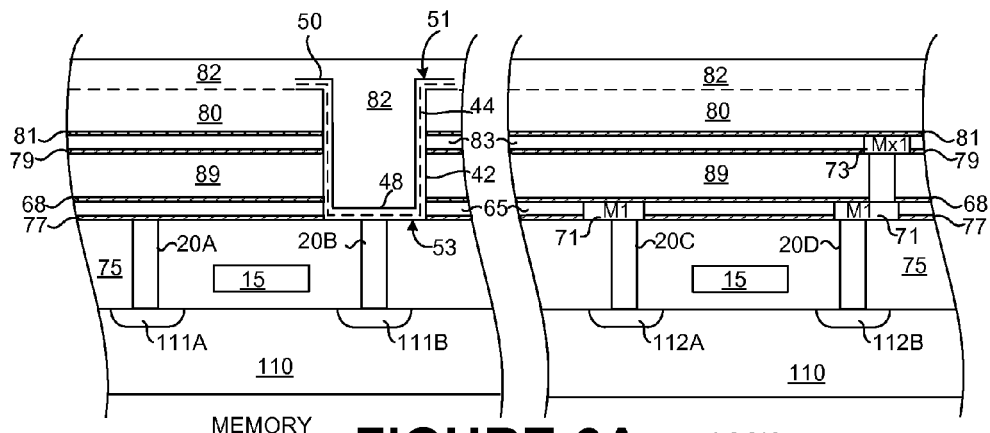
FIGS. 6A-6B illustrate a cross-sectional view of a process flow for forming an embedded DRAM system having multiple metal layers in the logic region located between a top and bottom surface of a MIM capacitor, in accordance with a sixth embodiment of the present disclosure.

Referring now to FIGS. 6A-6B, a cross-sectional view of a process flow for forming an embedded DRAM system having multiple metal layers in the logic region located between a top and bottom surface of a MIM capacitor, in accordance with a sixth embodiment of the present disclosure. Partially completed semiconductor structure 106-A of FIG. 6A is fabricated according to the process described for FIGS. 2A-2B, including the conventional processing to form M1 first metal layer 71 in dielectric layer 65, over which is formed second etch-stop layer 68, over which is next disposed first dielectric layer 89. Then, over dielectric layer 89 is disposed etch-stop layer 79, which is then processed to dispose dielectric layer 83 thereon. Dielectric layer 83 is etched to form a groove (not shown) for metallization region Mx1 interconnects 73. A mask (not shown) is placed on dielectric layer 83 and patterned to form intermediate V1L via 18D, which is then filled with a conductive material, such as tungsten. Metallization region Mx1 interconnect 73 is then filled with conductive material as well. In one embodiment, metallization region Mx1 interconnect 73 and via 18D are filled with copper or a copper alloy using a dual damascene process.

Disposed above dielectric layer 83 is etch-stop layer 81 followed by second dielectric layer 80. MIM capacitor 50 is formed in dielectric layer 80, after etching through dielectric layer 80, etch-stop layer 81, dielectric layer 83, etch-stop layer 79, dielectric layer 89, etch-stop layer 68, dielectric layer 65, and finally etch-stop layer 77 in order to reach contact 20B, in a process similar to that described in FIG. 2C, albeit with extra etch-stop layers. Layer 82 is then built up to fill cavity 70 (shown in FIG. 1A) of MIM capacitor 50 and to rise above dielectric layer 80 and above top surface 51 of MIM capacitor 50.

FIG. 6A illustrates only a first metal layer M1 71, one intermediate metal layer Mx1 73, and only one contact 20D using a via and plugs to reach upper metal layers. However, the present disclosure is well suited to using any quantity and combination of vias and/or metal layers disposed in structure layers at heights corresponding to levels between top surface 51 and bottom surface 53 of MIM capacitor 50 to couple appropriate contacts for transistor sources and/or drains in the logic region to reach upper metal layers, as dictated by place and route for a given circuit.

Referring now to FIG. 6B, a mask (not shown) is disposed over dielectric layer 82 to selectively etch Vx1M via 18A through second dielectric layers 82 and 80, etch-stop layers 81 dielectric layer 83, etch-stop layer 79, first dielectric layer 89, etch-stop layer 68 dielectric layer 65, etch-stop layer 77, and finally dielectric layer 75, in order to reach contact 20A. Via 18A is filled with a tungsten plug. After removal of the mask, and to provide for a controlled etch in the future process steps, etch-stop layer 85 is provided on second dielectric layer 82 followed by the formation of third dielectric layer 87. Then, layer 87 is patterned to create grooves (not shown) in dielectric layer 87 and etch-stop layer 85 for metallization region Mx2 interconnects 72, where x2=x1+1. A mask (not shown) is placed on dielectric layer 87 and patterned to simultaneously form: interconnect via 22, to reach upper capacitor plate 48 of MIM capacitor 50; and via Vx1L 18E to reach metallization layer Mx1 73. Via 22 is only etched through a portion of dielectric layer 82 in order to reach upper capacitor plate 48 of MIM capacitor 50. Via Vx1L 18E is formed by etching through both dielectric layers 82 and 80. Both vias 22 and 18E, as well as grooves for metallization region Mx2 72, are filled with copper or a copper-based alloy in a dual damascene process. The resulting structure has both a reduced interconnect resistance and a reduced capacitance compared to other embedded DRAM systems.

The embodiments of the present disclosure are illustrative only and are not intended to limit the invention in any way. Methods and operations described herein can be performed in different combinations and permutations than the exemplary ones described herein, e.g., in a different set and/or order. Thus, one or more additional new operations may be inserted within the existing operations, or one or more operations may be abbreviated or eliminated, according to a given application, to obtain substantially the same function, way and result. Similarly, features and portions of structure and apparatus described herein can be combined in many ways to obtain substantially the same function, way, and result.

For example, the logic structures shown need not be repeated in every logic region. Some logic structures within an IC device can have fewer or more vias than shown depending on whether a higher level metal is necessary for the interconnect. Although the present disclosure has been described as an eDRAM having a MIM capacitor inserted between the substrate and the first metal layer, the process of the present disclosure can also be performed by inserting the MIM capacitor between two metal layers in a memory region. Any quantity of memory devices, e.g., an array, and logic devices apparatus as presently disclosed using methods disclosed, can be integrated on a given integrated circuit (IC), system-on-a-chip (SOC), wafer-scale integration (WSI), etc. in addition to other functional blocks and legacy devices and processes, though additional operations and masks and other materials may be required. While specific materials and processes have been described in the present embodiments, the present disclosure is well-suited to using any appropriate process technology and operations in order to provide for placement of metallization interconnects and vias disposed in the semiconductor structure, e.g., in layers corresponding to locations between upper and lower surfaces of the MIM capacitor. For example, single damascene process may be used for M1 metallization layer coupling to contacts. Similarly, while tungsten and copper are utilized herein for specific layers and vias, the present disclosure is well-suited to use of these and other conductors, such as aluminum, and other deposition, etch, removal, or chemical-mechanical polishing (CMP), as needed for a given process or technology, as dictated by a fabrication or foundry facility.

Other features of the present embodiments will be apparent from the accompanying drawings together with the detailed description. Accordingly, the specification and drawings are to be regarded in an illustrative rather than a restrictive sense. The skilled artisan would readily appreciate that the aforementioned embodiments are capable of various modifications. In conclusion, the present disclosure is defined by the claims, as set forth below.

What is claimed is:

1. A semiconductor structure built upon a substrate comprising:
   a memory region having embedded RAM;
   a logic region coupled to the memory region;
   a metal-insulator-metal (MIM) capacitor disposed in the memory region;
   one or more metal layers for metal lines located between a top surface and a bottom surface of the MIM capacitor; and
   one or more via plugs disposed in the logic region for coupling portions of the first metal layer to portions of another metal layer, disposed thereabove, wherein the one or more via plugs are disposed further apart from each other than the distance between a source contact and a drain contact of a given transistor.

2. The semiconductor structure of claim 1 wherein the one or more metal layers for metal lines are located only in the logic region of the semiconductor structure.

3. The semiconductor structure of claim 2 wherein the one or more metal layers for metal lines is disposed only in the logic region are located between the substrate and a top portion of the MIM capacitor.

4. The semiconductor structure of claim 1 wherein the one or more metal layers for metal lines are located only in the logic region and in a drain portion of the memory region.

5. The semiconductor structure of claim 1 wherein the logic region further comprises:
   one or more transistors, located only in the logic region, each having a source, a drain, and one or more contacts, for each of the source and the drain, that couple the source and that couple the drain to a respective portion of a first metal layer of the one or more metal layers for metal lines is disposed only in the logic region; and wherein a top surface of the one or more contacts of at least one transistor in the logic region is disposed at a height less than or equal to the height of the MIM capacitor in the memory region.

6. The semiconductor structure of claim 1 wherein:
at least one transistor in the logic region has a drain and a source;
the drain is coupled to a given quantity of via plugs or contact plugs;
the source is coupled to a given quantity of via plugs or contact plugs; and
the quantity of via plugs or contact plugs for the drain is not equal to the quantity of via plugs or contact plugs for the source.

7. The semiconductor structure of claim 1 further comprising:
a first metal layer of the memory region disposed above the MIM capacitor;
one or more transistors, located only in the memory region, each having a source, a drain, and one or more contacts, for each of the source and the drain, that couple the source and the drain respectively to the first metal layer of the memory region; and
one or more via plugs, disposed in the memory region, for coupling the first metal layer in the memory region to the one or more contacts of the one or more transistors located only in the memory region; and
wherein either the source or the drain of a given transistor in the memory region, but not both the source and the drain, is coupled to the MIM capacitor by a respective one or more vias or one or more contacts.

8. The semiconductor structure of claim 1 wherein one or more via plugs disposed in the memory region or in the logic region are tungsten, copper, or a combination thereof.

9. The semiconductor structure of claim 1 further comprising:
a metal layer disposed over both the memory region and the logic region, coupled to at least one transistor in each of the memory region and of the logic region; and
wherein the metal layer disposed over both the memory region and the logic region is a first metal layer for the memory region and is a second or higher metal layer for the logic region.

10. The semiconductor structure of claim 1 wherein via plugs in the logic region, that couple contacts for transistors in the logic region to a second metal layer in the logic region, have a height that is less than a distance from a first metal layer in the memory region to a contact for a transistor in the memory region.

11. The semiconductor structure of claim 1 wherein the one or more transistors in the logic region each have an equivalent parasitic capacitance to a transistor used in a logic circuit without embedded RAM.

12. A method of forming a semiconductor structure, the method comprising:
forming a transistor, having a source and a drain, in a logic region;
forming a transistor, having a source and a drain in a memory region;
forming a dielectric layer;
forming one or more contacts in the dielectric layer for the source and for the drain of the transistor in the logic region and the transistor in the memory region;
forming a metal-insulator-metal (MIM) capacitor in the dielectric layer that is coupled to the transistor disposed in the memory region;
forming one or more metal layers for metal lines within the dielectric layer at a location between a top surface and a bottom surface of the MIM capacitor; and
forming one or more via plugs in the logic region for coupling portions of the first metal layer to portions of another metal layer, disposed thereabove, wherein the one or more via plugs are disposed further apart from each other than a mating contact for a source and a drain of a given transistor.

13. The method of claim 12 wherein the one or more metal layers for metal lines formed in the semiconductor structure are located only in the logic region of the semiconductor structure.

14. The method of claim 13 wherein a first metal layer of the one or more metal layers for metal lines only in the logic region is electrically coupled to the one or more contacts of the source and to the one or more contacts of the drain of the transistor disposed in the logic region.

15. The method of claim 12 wherein the one or more metal layers for metal lines formed in the semiconductor structure are located only in the logic region and in a drain portion of the memory region of the semiconductor structure.

16. The method of claim 12 wherein the one or more metal layers for metal lines is located between the substrate and a top surface of the MIM capacitor.

17. The method of claim 12 wherein:
at least one transistor in the logic region has a drain and a source;
the drain is coupled to a given quantity of via plugs or contact plugs;
the source is coupled to a given quantity of via plugs or contact plugs; and
the quantity of via plugs or contact plugs for the drain is not equal to the quantity of via plugs or contact plugs for the source.

18. The method of claim 12 further comprising:
forming a first metal layer of the memory region disposed above the MIM capacitor;
forming one or more transistors, located only in the memory region, each having a source, a drain, and one or more contacts, for each of the source and the drain, that couple the source and the drain respectively to the first metal layer of the memory region; and
forming one or more via plugs, disposed in the memory region, for coupling the first metal layer in the memory region to the one or more contacts of the one or more transistors located only in the memory region; and
wherein either the source or the drain of a given transistor in the memory region, but not both the source and the drain, is coupled to the MIM capacitor by a respective one or more vias or one or more contacts.

19. The method of claim 12 wherein the one or more via plugs disposed in the memory region or in the logic region are tungsten, copper, or are a combination thereof.

20. The method of claim 12 further comprising: forming a metal layer disposed over both the memory region and the logic region, coupled to at least one transistor in each of the memory region and of the logic region; and wherein the metal layer disposed over both the memory region and the logic region is a first metal layer for the memory region and is a second or higher metal layer for the logic region.

21. The method of claim 12 wherein via plugs in the logic region, that couple contacts for transistors in the logic region to a second metal layer in the logic region, have a height that is less than a distance from a first metal layer in the memory region to a contact for a transistor in the memory region.

22. The method of claim 12 further comprising:
forming a first via in the dielectric layer to expose a portion of the MIM capacitor in the memory region;
creating a first plug in the first via with a first conductive material;
masking the first plug;
forming a set of vias in the dielectric layer to expose all of the one or more contacts of the drain of the transistor in the memory region and of the drain and source of the transistor in the logic region;
creating a set of plugs for the set of vias with a second conductive material; and
wherein the second conductive material has less resistance than the first conductive material.

23. The method of claim 12 further comprising:
forming a set of vias in the dielectric layer to expose a portion of the MIM capacitor in the memory region and to expose all of the one or more contacts of the drain of the transistor in the memory region and of the drain and source of the transistor in the logic region; and
creating a set of plugs for the set of vias with a conductive material.

24. The method of claim 12 further comprising:
forming a first via in the dielectric layer to expose all of the one or more contacts of the drain of the transistor in the memory region;
creating a first plug in the first via with a first conductive material;
masking the first plug;
forming a set of vias in the dielectric layer to expose a portion of the MIM capacitor in the memory region and to expose all of the one or more contacts of the drain and source of the transistor in the logic region;
creating a set of plugs for the set of vias with a second conductive material; and
wherein the second conductive material has less resistance than the first conductive material.

25. A semiconductor structure built upon a substrate comprising:
a memory region having embedded RAM;
a logic region coupled to the memory region;
a metal-insulator-metal (MIM) capacitor disposed in the memory region; and
one or more metal layers for metal lines located between a top surface and a bottom surface of the MIM capacitor, wherein the one or more metal layers for metal lines are located only in the logic region and in a drain portion of the memory region.

26. The semiconductor structure of claim 25, wherein:
at least one transistor in the logic region has a drain and a source;
the drain is coupled to a given quantity of via plugs or contact plugs;
the source is coupled to a given quantity of via plugs or contact plugs; and
the quantity of via plugs or contact plugs for the drain is not equal to the quantity of via plugs or contact plugs for the source.

27. The semiconductor structure of claim 25, further comprising:
a metal layer disposed over both the memory region and the logic region, coupled to at least one transistor in each of the memory region and of the logic region; and
wherein the metal layer disposed over both the memory region and the logic region is a first metal layer for the memory region and is a second or higher metal layer for the logic region.

28. A semiconductor structure built upon a substrate comprising:
a memory region having embedded RAM;
a logic region coupled to the memory region;
a metal-insulator-metal (MIM) capacitor disposed in the memory region; and
one or more metal layers for metal lines located between a top surface and a bottom surface of the MIM capacitor; and
wherein:
at least one transistor in the logic region has a drain and a source;
the drain is coupled to a given quantity of via plugs or contact plugs;
the source is coupled to a given quantity of via plugs or contact plugs; and
the quantity of via plugs or contact plugs for the drain is not equal to the quantity of via plugs or contact plugs for the source.

29. The semiconductor structure of claim 28, further comprising:
a metal layer disposed over both the memory region and the logic region, coupled to at least one transistor in each of the memory region and of the logic region; and
wherein the metal layer disposed over both the memory region and the logic region is a first metal layer for the memory region and is a second or higher metal layer for the logic region.

* * * * *